US011885645B2

(12) United States Patent
Latham et al.

(10) Patent No.: US 11,885,645 B2
(45) Date of Patent: Jan. 30, 2024

(54) SUPPLY VOLTAGE CONFIGURABLE SENSOR

(71) Applicant: Allegro MicroSystems, LLC, Manchester, NH (US)

(72) Inventors: Alexander Latham, Harvard, MA (US); Evan Shorman, Hooksett, NH (US); Michael C. Doogue, Bedford, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/350,045

(22) Filed: Jun. 17, 2021

(65) Prior Publication Data
US 2022/0404182 A1 Dec. 22, 2022

(51) Int. Cl.
*G01D 18/00* (2006.01)
(52) U.S. Cl.
CPC .................... *G01D 18/00* (2013.01)
(58) Field of Classification Search
CPC .............. G01D 18/00; G01R 33/0023; G01R 33/0082; G01R 33/072
See application file for complete search history.

(56) References Cited

U.S. PATENT DOCUMENTS

| 5,389,889 | A | 2/1995 | Towne et al. |
| 6,002,338 | A | 12/1999 | Pavlov et al. |
| 6,111,437 | A | 8/2000 | Patel |
| 6,288,567 | B1 | 9/2001 | Fink |
| 6,542,847 | B1 | 4/2003 | Lohberg et al. |
| 6,687,644 | B1 | 2/2004 | Zinke et al. |
| 6,815,944 | B2 | 11/2004 | Vig et al. |
| 6,968,484 | B2 | 11/2005 | Hummel |
| 7,026,808 | B2 | 4/2006 | Vig et al. |
| 7,319,418 | B2 | 1/2008 | Fink |
| 7,747,146 | B2 | 6/2010 | Milano et al. |
| 8,054,071 | B2 | 11/2011 | Doogue et al. |

(Continued)

FOREIGN PATENT DOCUMENTS

| DE | 19634714 A1 | 3/1998 |
| DE | 19650935 A1 | 6/1998 |

(Continued)

OTHER PUBLICATIONS

U.S. Appl. No. 16/935,656, filed Jul. 22, 2020, Metivier et al.
(Continued)

*Primary Examiner* — Lee E Rodak
*Assistant Examiner* — Martin Walter Braunlich
(74) *Attorney, Agent, or Firm* — Daly, Crowley, Mofford & Durkee, LLP

(57) ABSTRACT

A sensor includes a sensing element configured to generate a sensing element output signal indicative of a sensed parameter and a signal path responsive to the sensing element output signal and having at least one of an adjustable gain or an adjustable offset, wherein the signal path is configured to generate a sensor output signal indicative of the sensed parameter. A supply voltage detector is configured to generate a supply voltage signal indicative of which of a plurality of voltage ranges a supply voltage of the sensor falls within and at least one of the adjustable gain or the adjustable offset is adjustable in response to the supply voltage signal.

20 Claims, 4 Drawing Sheets

(56) References Cited

U.S. PATENT DOCUMENTS

| | | | |
|---|---|---|---|
| 8,084,969 | B2 | 12/2011 | David et al. |
| 8,122,159 | B2 | 2/2012 | Monreal |
| 8,127,603 | B2 * | 3/2012 | Nagata .................. G01C 19/56 |
| | | | 73/1.01 |
| 8,183,982 | B2 | 5/2012 | Scherr |
| 8,350,563 | B2 | 1/2013 | Haas et al. |
| 8,519,819 | B2 | 8/2013 | Scherr |
| 8,577,634 | B2 | 11/2013 | Donovan et al. |
| 8,624,588 | B2 | 1/2014 | Vig et al. |
| 8,754,640 | B2 | 6/2014 | Vig et al. |
| 8,860,404 | B2 | 10/2014 | Dwyer et al. |
| 8,922,331 | B2 | 12/2014 | Scherr |
| 8,994,369 | B2 | 3/2015 | Vig et al. |
| 9,068,859 | B2 | 6/2015 | Dwyer et al. |
| 9,151,771 | B2 | 10/2015 | Vig et al. |
| 9,172,565 | B2 | 10/2015 | Cadugan et al. |
| 9,222,990 | B2 | 12/2015 | Dwyer et al. |
| 9,245,547 | B1 | 1/2016 | Latham et al. |
| 9,300,235 | B2 | 3/2016 | Ng et al. |
| 9,552,315 | B2 | 1/2017 | Monreal |
| 9,621,140 | B1 | 4/2017 | Fernandez et al. |
| 9,634,715 | B2 | 4/2017 | Scheinkerman et al. |
| 9,664,748 | B2 | 5/2017 | Friedrich et al. |
| 9,698,742 | B2 | 7/2017 | Chaware et al. |
| 9,787,495 | B2 | 10/2017 | Vreeland et al. |
| 10,101,410 | B2 | 10/2018 | Latham et al. |
| 10,216,559 | B2 | 2/2019 | Fernandez |
| 10,436,606 | B2 | 10/2019 | Kerdraon et al. |
| 10,473,486 | B2 | 11/2019 | Doogue et al. |
| 10,480,957 | B2 | 11/2019 | Kerdraon et al. |
| 10,481,218 | B2 | 11/2019 | Prentice et al. |
| 10,495,485 | B2 | 12/2019 | Burdette et al. |
| 10,571,301 | B2 | 2/2020 | Doogue et al. |
| 10,578,679 | B2 | 3/2020 | Sitorus et al. |
| 10,598,514 | B2 | 3/2020 | Pepka et al. |
| 10,656,170 | B2 | 5/2020 | Lim et al. |
| 10,725,122 | B2 | 7/2020 | Rubinsztain et al. |
| 10,747,708 | B2 | 8/2020 | Kozomora et al. |
| 10,782,366 | B2 | 9/2020 | Stewart |
| 10,908,230 | B2 | 2/2021 | Rubinsztain et al. |
| 11,029,370 | B1 | 6/2021 | Zimmermann et al. |
| 2002/0021144 | A1 | 2/2002 | Morgan et al. |
| 2003/0141862 | A1 | 7/2003 | Vig et al. |
| 2005/0144546 | A1 | 6/2005 | Igeta et al. |
| 2006/0156075 | A1 | 7/2006 | Mitsuishi |
| 2009/0075607 | A1 | 3/2009 | Khoury |
| 2010/0026279 | A1 | 2/2010 | Vig et al. |
| 2010/0211347 | A1 | 8/2010 | Friedrich et al. |
| 2012/0007680 | A1 | 1/2012 | Hijikata et al. |
| 2013/0335069 | A1 | 12/2013 | Vig et al. |
| 2013/0335074 | A1 | 12/2013 | Dwyer et al. |
| 2014/0208151 | A1 | 7/2014 | Fernandez |
| 2014/0237298 | A1 | 8/2014 | Pe'er |
| 2015/0185279 | A1 | 7/2015 | Milano et al. |
| 2015/0249385 | A1 | 9/2015 | Takahashi |
| 2015/0269018 | A1 | 9/2015 | Ellis |
| 2016/0025820 | A1 | 1/2016 | Scheller et al. |
| 2016/0097692 | A1 | 4/2016 | Hirai et al. |
| 2016/0097825 | A1 | 4/2016 | Petrie et al. |
| 2016/0123780 | A1 | 5/2016 | Snyder et al. |
| 2016/0139230 | A1 | 5/2016 | Petrie et al. |
| 2017/0092024 | A1 | 3/2017 | Slama et al. |
| 2017/0219662 | A1 | 8/2017 | Prentice et al. |
| 2018/0129196 | A1 | 5/2018 | Hainz et al. |
| 2018/0136999 | A1 | 5/2018 | Fernandez |
| 2018/0275823 | A1 | 9/2018 | Lim |
| 2019/0018079 | A1 | 1/2019 | Latham et al. |
| 2019/0346294 | A1 | 11/2019 | Coceani et al. |
| 2020/0386575 | A1 | 12/2020 | Weiland et al. |
| 2020/0402929 | A1 * | 12/2020 | Lentz ...................... H03K 5/00 |
| 2020/0409886 | A1 | 12/2020 | Bussing et al. |

FOREIGN PATENT DOCUMENTS

| | | | |
|---|---|---|---|
| DE | 19900774 A1 | 7/2000 | |
| EP | 0944888 A2 | 9/1999 | |
| EP | 2789983 A1 * | 10/2014 | ............... G01D 3/02 |
| WO | WO 9825148 A2 | 6/1998 | |
| WO | WO 2010/150416 | 12/2010 | |

OTHER PUBLICATIONS

U.S. Appl. No. 16/788,505, filed Feb. 12, 2020, Scheller et al.
U.S. Appl. No. 16/787,326, filed Feb. 11, 2020, Metivier et al.
U.S. Appl. No. 62/337,478, filed May 17, 2016, Burdette et al.
Allegro Microsystems, "ACS37002 400kHz, High Accuracy Current Sensor" Datasheet, Oct. 16, 2020; 40 Pages.
Allegro Microsystems, "ALS31000 Unidirectional Linear Hall-Effect Sensor IC with Analog Output in Miniature Low-Profile Surface-Mount Package" Datasheet, Jan. 20, 2020; 10 Pages.
Allegro Microsystems, "ACS724LMC, ACS725LMC High Accuracy Hall-Effect-Based Current Sensor with 265 µΩ Integrated Conductor" Datasheet, Sep. 25, 2020; 17 Pages.
Allegro Datasheet A19530 "High Feature Three-Wire Hall-Effect Transmission Speed And Direction Sensor IC" Sep. 13, 2018, 18 pages.
Office Action dated Apr. 19, 2018 for U.S. Appl. No. 15/350,400; 18 pages.
Response to Office Action dated Apr. 19, 2018 for U.S. Appl. No. 15/350,400; Response filed on May 9, 2018 18 pages.
Final Office Action dated Aug. 6, 2018 for U.S. Appl. No. 15/350,400; 24 pages.
Response to Final Office Action dated Aug. 6, 2018 for U.S. Appl. No. 15/350,400; Response filed on Nov. 5, 2018 18 pages.
Notice of Allowance dated Nov. 21, 2018 for U.S. Appl. No. 15/350,400; 7 pages.
PCT International Search Report and Written Opinion dated Mar. 8, 2018 for International Application No. PCT/US2017/059148; 16 pages.
PCT International Preliminary Report dated May 14, 2019 for Intl. Pat. Appl. No. PCT/US2017/059148; 9 pages.
Korean Office Action (with Machine English Translation from Espacenet.com) dated Aug. 28, 2020 for Korean Application No. 10-2019-7013456; 15 Pages.
Response (with Machine English Translation from Espacenet.com) to Korean Office Action dated Aug. 28, 2020 for Korean Application No. 10-2019-7013456; Response filed Oct. 28, 2020; 102 Pages.
Korean Office Action (with Machine English Translation from Espacenet.com) dated Nov. 6, 2020 for Korean Application No. 10-2019-7013456; 6 Pages.
Response (with Machine English Translation from Espacenet.com) to Korean Office Action dated Nov. 6, 2020 for Korean Application No. 10-2019-7013456; Response filed Dec. 8, 2020; 22 Pages.
European 161/162 Communication dated Jun. 6, 2019 for European Application No. 17809079.1; 3 Pages.
Response to Office Action dated Jun. 6, 2019 for European Application No. 17809079.1; Response filed on Dec. 16, 2019 28 pages.
Office Action dated Apr. 2, 2020 for U.S. Appl. No. 16/040,716; 20 pages.
Response to Office Action dated Apr. 2, 2020 for U.S. Appl. No. 16/040,716; Response filed on Apr. 23, 2020; 14 pages.
Notice of Allowance dated May 6, 2020 for U.S. Appl. No. 16/040,716; 10 pages.
European Extended Search Report dated Dec. 12, 2019 for European Application No. 19185340.7; 7 pages.
Response (with Amended Claims & Specification) to European Official Communication dated Jan. 27, 2020 and to Search Opinion dated Dec. 12, 2019 for European Application No. 19185340.7; Response filed Jul. 22, 2020; 24 Pages.
Office Action dated Jul. 22, 2020 for U.S. Appl. No. 16/901,103; 20 pages.
Response to Office Action dated Jul. 22, 2020 for U.S. Appl. No. 16/901,103; Response filed on Aug. 13, 2020; 11 pages.
Notice of Allowance dated Nov. 23, 2020 for U.S. Appl. No. 16/901,103; 11 pages.

(56) References Cited

OTHER PUBLICATIONS

European Examination Report dated Mar. 18, 2021 for European Application No. 19185340.7, 5 Pages.
Notice of Allowance dated Apr. 30, 2021 for U.S. Appl. No. 16/881,238; 16 Pages.

* cited by examiner

SUPPLY VOLTAGE CONFIGURABLE SENSOR

CROSS REFERENCE TO RELATED APPLICATIONS

Not Applicable.

STATEMENT REGARDING FEDERALLY SPONSORED RESEARCH

Not Applicable.

FIELD

The present disclosure relates generally to sensor integrated circuits and more specifically to such circuits that are configurable based on supply voltage.

BACKGROUND

As is known, sensors are used to perform various functions in a variety of applications. Some sensors include one or more magnetic field sensing elements, such as a Hall effect element or a magnetoresistive element, to sense a magnetic field associated with proximity or motion (e.g., speed or direction of motion) of a target object, such as a ferromagnetic object in the form of a gear or ring magnet, as examples. Other sensors can sense angular position of the target relative to the sensor and/or a current level through a conductor target, as examples. Magnetic field sensor applications include, but are not limited to, a magnetic switch that senses the proximity of a ferromagnetic object, a rotation detector (or movement detector) that senses passing features of a target, an angle sensor that senses an angle of a direction of a magnetic field, a current sensor that senses a magnetic field generated by a current carried by a conductor, and a linear magnetic field sensor that senses a magnetic field density of a magnetic field. Other sensor types include optical sensors and pressure sensors.

Sensor integrated circuits (ICs) have power and ground connections. Generally, sensor ICs are designed to operate with a predetermined nominal supply voltage level. Thus, customers are required to buy different sensor ICs to accommodate different supply voltages.

Some sensor ICs generate an output signal (e.g., voltage) that can vary proportionally with variations in supply voltage. For example in some such sensors, the quiescent voltage output and sensitivity can be proportional to the supply voltage. Such sensor ICs are sometimes referred to as "ratiometric". However, the supply voltage range over which ratiometric sensors can accurately operate is often limited, such as to within +/−10% of the nominal supply voltage.

SUMMARY

The present disclosure provides a sensor that is self-configurable based on supply voltage level. The sensor detects which range of voltages a supply voltage of the sensor falls within and selects between different gain and/or offset settings based on the detected supply voltage range. With this arrangement, gain and/or offset settings are accurately optimized for different supply voltage ranges and wide ranges of possible supply voltages can be accommodated, thereby advantageously enabling customers to purchase a single device that is suitable for use with different supply voltages.

According to the disclosure, a sensor includes a sensing element configured to generate a sensing element output signal indicative of a sensed parameter and a signal path responsive to the sensing element output signal and having at least one of an adjustable gain or an adjustable offset, wherein the signal path is configured to generate a sensor output signal indicative of the sensed parameter. A supply voltage detector is configured to generate a supply voltage signal indicative of which of a plurality of voltage ranges a supply voltage of the sensor falls within. At least one of the adjustable gain or the adjustable offset is adjustable in response to the supply voltage signal.

The sensor can include one or more of the following features alone or in combination. The signal path can include an amplifier responsive to the sensing element output signal and having an adjustable gain, wherein the amplifier is configured to generate an amplified signal and an output driver responsive to the amplified signal and having an adjustable offset, wherein the output driver is configured to generate the sensor output signal. The gain of the amplifier can be adjustable in response to the supply voltage signal and/or the offset of the output driver can be adjustable in response to the supply voltage signal. The supply voltage signal can result in a coarse adjustment of one or both of the adjustable gain or the adjustable offset. A memory can be configured to store settings for one or both of the adjustable gain or the adjustable offset based on which of a plurality of voltage ranges the supply voltage falls within. The sensor can include a multiplexer coupled to receive the supply voltage signal and configured to selectively couple settings from the memory to the signal path based on the supply voltage signal. A temperature sensor can provide a temperature measurement and the coupled settings can be based on both the stored settings and the temperature.

The supply voltage detector can be coupled to receive the supply voltage and include at least one comparator configured to generate the supply voltage signal indicative of which of the plurality of voltage ranges the supply voltage falls within based on comparison of the supply voltage to a threshold. The comparator can include hysteresis. The supply voltage detector can include one or more terminals of the sensor coupled to receive an externally programmable signal indicative of which of the plurality of voltage ranges the supply voltage falls within. The sensor can be provided as an integrated circuit. The plurality of voltage ranges can include two voltage ranges and the supply voltage signal can be a two-state signal indicative of the which of the two voltage ranges the supply voltage falls within. A delay circuit can be configured to delay the sensor output signal following power up of the sensor. A filter can be configured to prevent voltage spikes on the supply voltage from affecting the supply voltage signal. A fault detector can be responsive to the supply voltage signal for adjusting a trip level of the fault detector. The supply voltage signal can be coupled to one or more circuits to adjust one or more of a reference voltage level or an internal pull up voltage level. The sensor output signal can be a digital signal or an analog signal. An analog sensor output signal can vary ratiometrically with variations in the supply voltage. The sensing element can include one or more magnetic field sensing elements. The sensed parameter can include one or more of a magnetic field strength, a proximity of a target, a speed of motion of the target, a direction of motion of the target, an angular position of the target, a current level, a light level, or a pressure level. The sensor can be a linear sensor, a proximity sensor, a speed sensor, a direction sensor, an angle sensor, a current sensor, an optical sensor, or a pressure sensor.

Also described is a method for providing a sensor including detecting which of a plurality of voltage ranges a supply voltage of the sensor falls within and sensing a parameter with a sensing element to generate a sensing element output signal. The method further includes processing the sensing element output signal to generate an output signal of the sensor, wherein processing includes one or both of adjusting a gain or adjusting an offset based on the detected voltage range.

The method can include one or more of the following features alone or in combination. The detected voltage range can result in a coarse adjustment of one or both of the adjustable gain or the adjustable offset. The method can further include storing settings for one or both of the adjustable gain or the adjustable offset based on the detected voltage range. The method can further include selectively coupling stored settings to a signal processing path with which the sensing element output signal is processed based on the detected voltage range. The method can further include measuring a temperature and the coupled settings can be based on both the stored settings and the measured temperature. Detecting the voltage range can include comparing the supply voltage to a threshold.

Also described is a sensor including a sensing element configured to generate a sensing element output signal indicative of a sensed parameter and means for processing the sensing element output signal by adjusting at least one of an adjustable gain or an adjustable offset and for generating a sensor output signal indicative of the sensed parameter. The sensor further includes means for detecting which of a plurality of voltage ranges a supply voltage of the sensor falls within, wherein the processing means is responsive to the detecting means for adjusting at least one of the adjustable gain or the adjustable offset.

DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the disclosure. Like numbers in the figures denote like elements.

DETAILED DESCRIPTION

Figure 1:
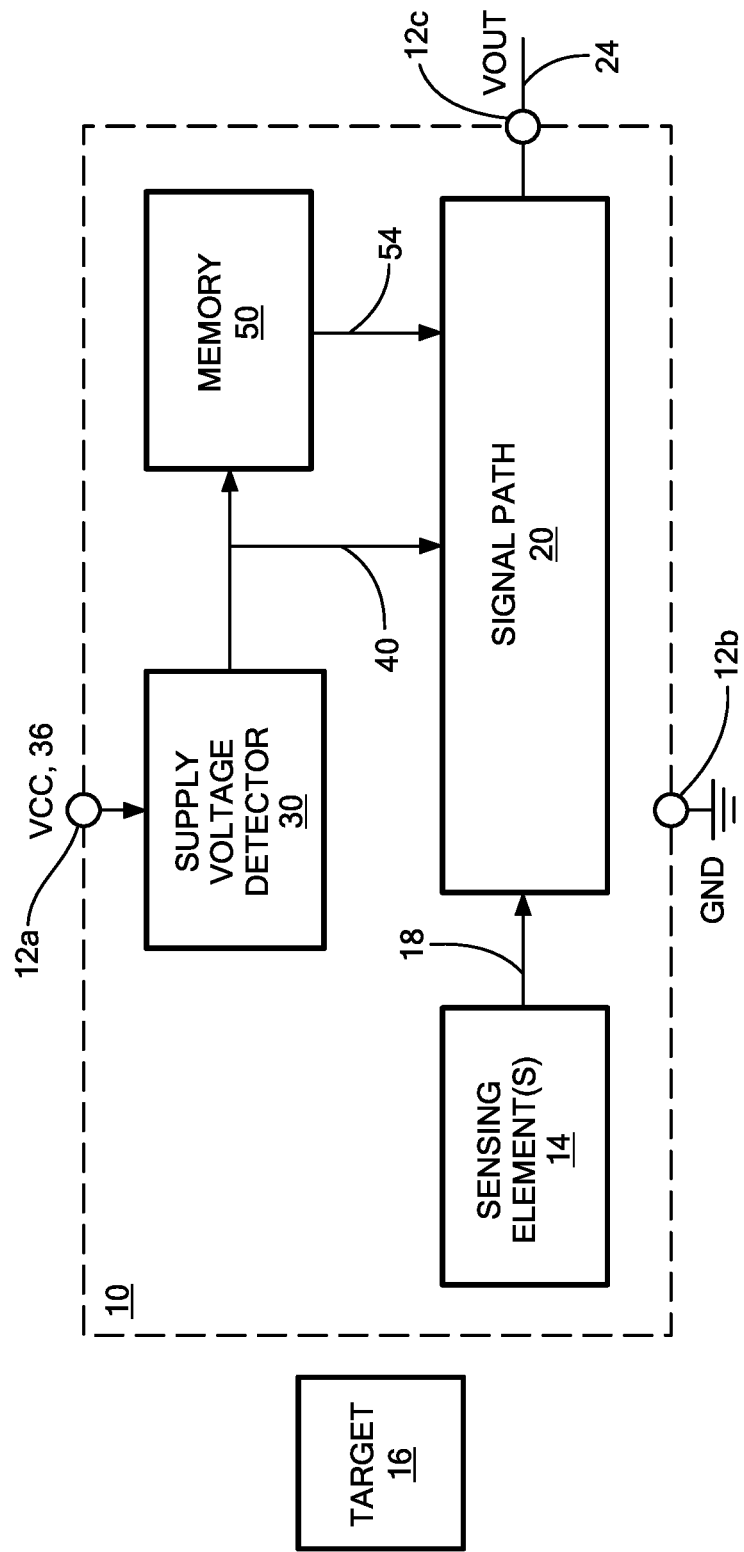
FIG. 1 is a block diagram of a sensor that is configurable based on supply voltage according to the disclosure.

Referring to FIG. 1, sensor 10 includes one or more sensing elements 14 configured to generate a sensing element output signal 18 indicative of a sensed parameter and a signal path 20 responsive to the sensing element output signal and having at least one of an adjustable gain or an adjustable offset. The signal path 20 is configured to generate a sensor output signal VOUT 24 indicative of the sensed parameter. A supply voltage detector 30 is configured to generate a supply voltage signal 40 indicative of which of a plurality of voltage ranges a supply voltage VCC 36 of the sensor falls within. At least one of the adjustable gain or the adjustable offset is adjustable in response to the supply voltage signal 40. It will be appreciated by those of ordinary skill in the art that while embodiments are described as having gain and offset that are adjustable based on the supply voltage signal 40, in some embodiments only one of the gain or offset may be adjusted.

The supply voltage signal 40 is coupled to the signal path 20 and results in a coarse adjustment of one or both of the adjustable gain or the adjustable offset. Memory 50 can store settings for one or both of the adjustable gain or the adjustable offset based at least in part on which of the plurality of voltage ranges the supply voltage VCC 36 falls within. In embodiments, stored settings 54 can be selectively coupled to the signal path 20 based at least in part of the supply voltage signal 40.

With this arrangement, sensor 10 is configurable to optimize operation based on which of a plurality of discrete ranges of supply voltages VCC 36 falls within. For example, gain and offset of the signal path 20 can be tailored to values uniquely optimized for the different supply voltage ranges and wide ranges of possible supply voltages can be accommodated. Further, while the supply voltage signal 40 can result in course adjustments to the gain and offset based on the detected supply voltage range, settings stored in memory can result in other adjustments (e.g., fine adjustments) to the gain and offset values that may be based in part on the detected supply voltage and in part on other factors, such as temperature, as will be explained.

Sensor 10 can take various forms, including but not limited to a magnetic field sensor, in which the sensing element(s) 14 include on or more magnetic field sensing elements. Magnetic field sensors can sense a magnetic field strength in order to detect proximity of a target 16, speed of motion of the target, direction of motion of the target, angular position of the target relative to the sensor, and/or a current level through a conductor target, as examples. Magnetic field sensor applications include, but are not limited to, a magnetic switch that senses the proximity of a ferromagnetic object, a rotation detector (or movement detector) that senses passing features of a target, an angle sensor that senses an angle of a direction of a magnetic field, a current sensor that senses a magnetic field generated by a current carried by a conductor, and a linear magnetic field sensor that senses a magnetic field density of a magnetic field. Sensor 10 can also be an optical sensor or a pressure sensor as other non-limiting examples. In general, sensor 10 can be any sensor that generates one or more output signals indicative of a sensed parameter and that is processed by at least one of an adjustable gain or an adjustable offset control element.

Depending on the sensor type and parameter sensed by the sensing elements 14, the target 16 can take various forms. For example, in the case of a magnetic field sensor 10 with magnetic field sensing elements 14, the target 16 can be a ring magnet with detectable magnetic domains or a ferromagnetic target with features (e.g., gear teeth) that pass the sensor as the target rotates, in which case the magnetic field sensor can be used with a so-called back-bias magnet.

Sensor 10 can have a first terminal 12a coupled to a power supply denoted as VCC 36 and a second terminal 12b coupled to a fixed reference voltage, for example, a ground voltage, denoted as GND. A third terminal 12c of the sensor 10 permits communication of a sensor output signal(s)

VOUT 24 to circuits and systems external to the sensor. As will be appreciated, while the example sensor 10 includes a single terminal 12c to communicate an output signal, in general, sensor 10 can have one or more output terminals with which to communicate one or more output signals. Further, sensor output signal VOUT 24 can be provided in the form of one or more dedicated voltage signals in a so-called three wire, or three terminal configuration as shown or a current signal in a so-called two wire, or two terminal configuration in which the sensor output signal can be provided in the form of a current superimposed on the sensor power terminal 12a and ground terminal 12b.

Sensor output signal VOUT 24 can be an analog or digital signal. In some embodiments in which the sensor output signal 24 is an analog signal, the output signal can vary ratiometrically with respect to a predetermined range of supply voltages VCC 36. By ratiometric, it is meant that the output signal changes in proportion to a change in the supply voltage VCC 36. However, it is often only possible for the output signal to change in this manner over a relatively narrow range of supply voltages (e.g., +/−10% of a nominal supply voltage).

In embodiments in which sensor 10 is a magnetic field sensor, sensing elements 14 are magnetic field sensing elements as can take various forms such as Hall effect elements, magnetoresistance elements, or magnetotransistors, and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Figure 2:
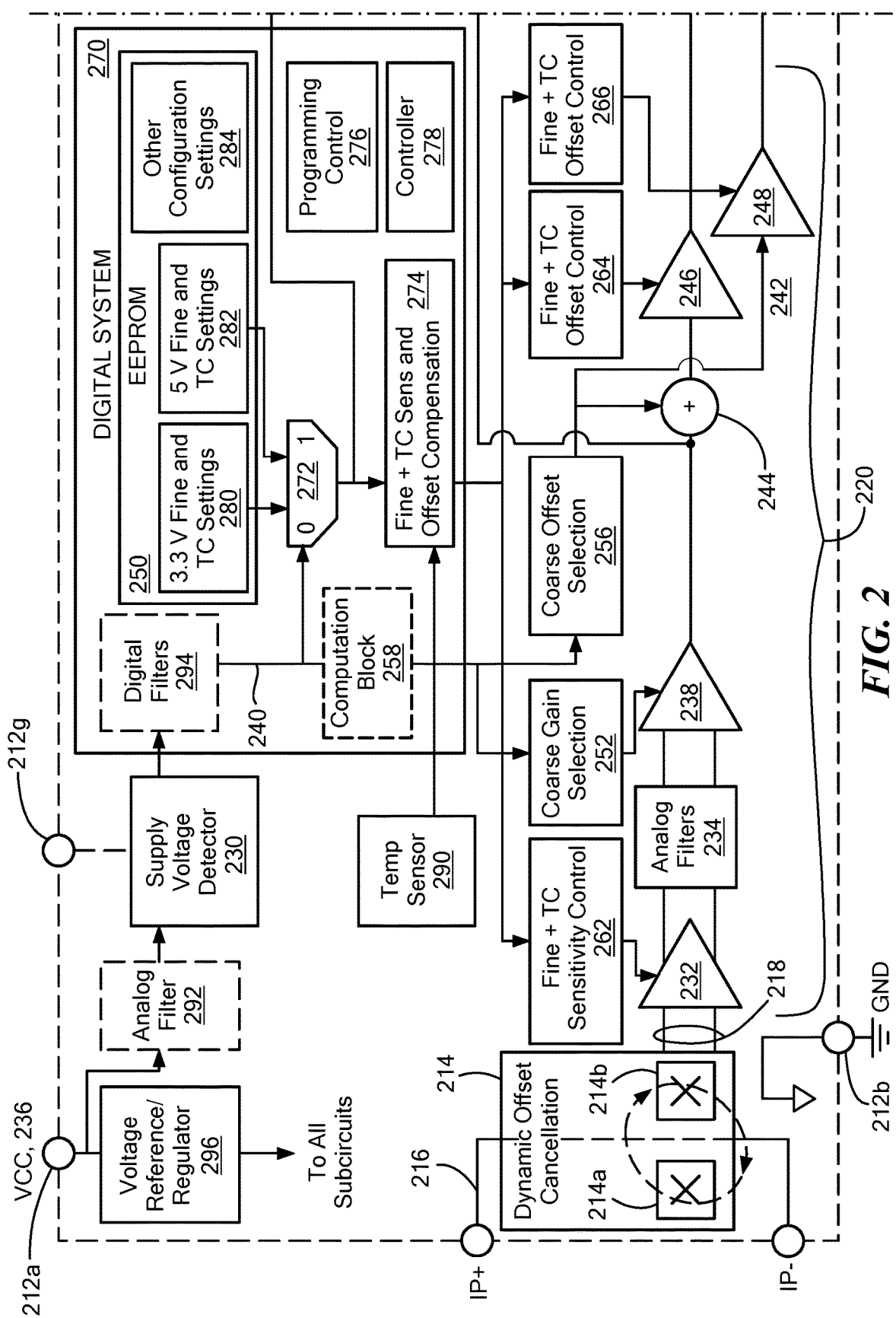
FIG. 2 is a block diagram of an example sensor according to the disclosure.
Figure 2:
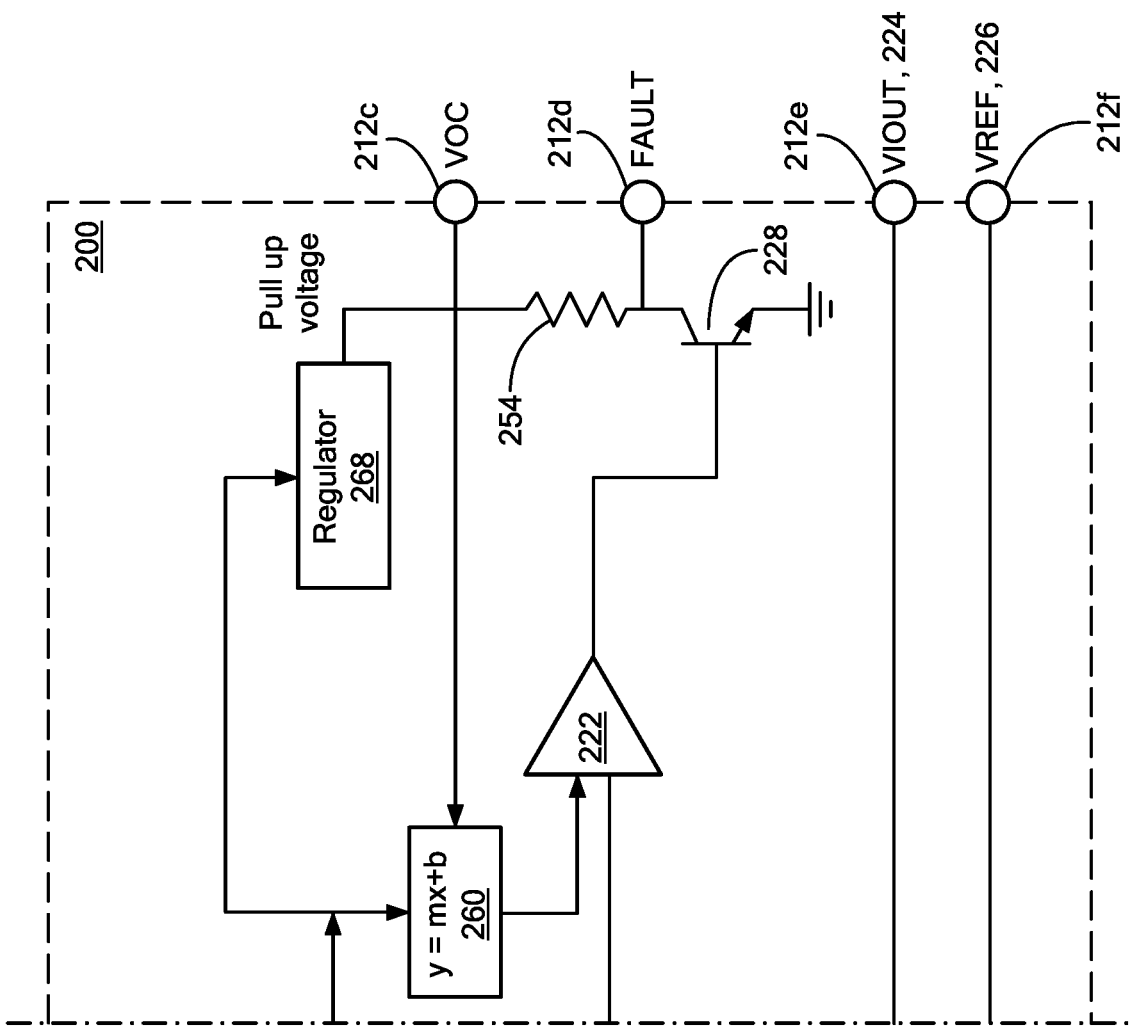

Signal path 20 structure and processing can vary to suit the particular sensor 10 in which it is employed. In general, signal path 20 processes the sensing element output signal 18 and generates sensor output signal 24. Signal path 20 includes at least one of an adjustable gain or an adjustable offset. For example, signal path 20 can include an amplifier having an adjustable gain and/or an output driver having an adjustable offset as shown in FIG. 2. The adjustable gain (as may be implemented with an amplifier) can be adjustable in response to the supply voltage signal 40 and the adjustable offset (as may be implemented with an output driver) can also be adjustable in response to the supply voltage signal. An example signal path 220 is shown in greater detail in FIG. 2.

Sensor 10 can be provided in the form of an integrated circuit (IC), with connections 12a-12c provided by pins, leads or terminals of the IC.

Referring also to FIG. 2, sensor 200 can be the same as or similar to sensor 10 of FIG. 1 and thus, can include sensing elements 214, here in the form of two Hall effect elements 214a, 214b, a supply voltage detector 230, here including one or more comparators, memory 250 as may take the form of an electrically erasable programmable read-only memory (EEPROM), and a signal path 220. Sensing elements 214 generate a sensing element output signal 218 indicative of a sensed parameter. Signal path 220 is responsive to the sensing element output signal 218 and includes at least one of an adjustable gain or an adjustable offset. The signal path 220 is configured to generate a sensor output signal, and here two sensor output signals VIOUT 224 and VREF 226, as shown.

Supply voltage detector 230 is configured to generate a supply voltage signal 240 indicative of which of a plurality of voltage ranges a supply voltage VCC 236 of the sensor falls within. At least one of the adjustable gain or the adjustable offset is adjustable in response to the supply voltage signal 240.

Sensor 200 can be provided in the form of an integrated circuit including pins, leads or terminals 212a-212g. Terminal 212a can receive the supply voltage VCC 236 and terminal 212b can be coupled to a reference potential such as ground. Terminals 212c, 212d can be used to communicate fault information and terminals 212e, 212f can be used to communicate sensor output signals 224, 226 to external circuits and systems.

A further terminal 212g may, optionally, be provided through which a user can provide an external input signal to the sensor to set, or program the supply voltage range of sensor operation. As non-limiting examples, the user-provided input signal can establish a sensor gain and/or offset that is related to the level of the external input signal (e.g., proportional). To this end, terminal 212g can be coupled to supply voltage detector 230 with which the external input signal is compared to one or more thresholds to generate the supply voltage signal 240. Example formats for such an externally provided input signal could be a two-state digital signal or an analog signal having more than two possible levels, corresponding to more than two possible supply voltage ranges. As one non-limiting example, providing a ground potential at terminal 212g can correspond to a 3.3 V supply and tying terminal 212g to VCC can correspond to a 5 V supply. These connections could be recognized quickly, especially on startup to avoid any glitches on power up, particularly if there is a slow turn on since it would avoid an unknown period as VCC ramps up and first goes to the 3.3 V settings and then goes to the 5 V settings.

Sensor 200 can be a current sensor and include a conductor 216 configured to carry a current for sensing by the sensing elements 214. Sensor output signal VIOUT 224 provides an output signal having a voltage level corresponding to the current applied through the conductor 216. Output signal VREF 226 is a reference output that allows for differential measurement of the sensor output signal VIOUT 224.

While particular output signal formats are described, the sensor output signal(s) can be provided in various formats including, but not limited to PWM format, Single Edge Nibble Transmission (SENT) format, a Serial Peripheral Interface (SPI) format, a Local Interconnect Network (LIN) format, a CAN (Controller Area Network) format, or an Inter-Integrated Circuit (I²C) format.

Sensing elements 214 can implement dynamic offset cancellation to remove offset that can be associated with the sensing elements. Dynamic offset cancellation circuitry may include chopping circuitry with switches configurable to drive the magnetic field sensing elements 214 in different directions such that selected drive and signal contact pairs are interchanged during each phase of a chopping clock signal and offset voltages of the different driving arrangements tend to cancel.

Example signal path 220 includes an amplifier 232, one or more filters 234, and a further amplifier 238. Amplifiers 232, 238 have an adjustable gain. Amplifier 232 has an adjustable gain that can be adjusted by a control block 262 to provide fine gain adjustment to the magnetic field sensing element signal 218. Amplifier 238 has an adjustable gain that can be adjusted by a coarse gain selection block 252 to provide coarse gain adjustment.

Signal path 220 also includes an output driver 242 as may include a summation element 244, amplifier 246, and amplifier 248. Summation element 244 introduces a coarse offset adjustment to the processed signal as may be provided by a coarse offset selection block 256. Amplifiers 246, 248 may be unity gain buffers and have an adjustable offset. More particularly, amplifier 246 has an adjustable offset that can be adjusted by a control block 264 to provide fine offset adjustment and amplifier 248 has an adjustable offset that can be adjusted by a control block 266 to provide fine offset adjustment.

Supply voltage detector 230 is coupled to receive supply voltage VCC 236 and is configured to detect which of a plurality of supply voltage ranges the supply voltage VCC falls within and generate the supply voltage signal 240 indicative of the detected supply voltage range. To this end, supply voltage detector 230 can include one or more comparison elements, such as comparators, and combinational logic by which the supply voltage VCC 236 is compared to one or more threshold levels.

In an example embodiment, four comparators of the supply voltage detector 230 compare VCC 236 to four respective thresholds in order to determine which of two possible supply voltage ranges the supply voltage VCC falls within. A first threshold can be provided at 3.0 volts, a second threshold can be provided at 3.6 volts, a third threshold can be provided at 4.5 volts, and a fourth threshold can be provided at 5.5 volts. If the supply voltage VCC 236 is determined to be greater than the first threshold but less than the second threshold, then the supply voltage VCC is within a first supply voltage range as may correspond to 3.0 volts to 3.6 volts, or 3.3 volts nominal. If the supply voltage VCC 236 is determined to be greater than the third threshold and less than the fourth threshold, then the supply voltage VCC is within a second supply voltage range as may correspond to 4.5 volts to 5.5 volts, or 5.0 volts nominal.

It will be appreciated that various circuitry and thresholds are possible for detecting which of two supply voltage ranges the supply voltage VCC 236 falls within. For example, as an alternative to using four comparators with respective thresholds to establish two supply voltage ranges, two comparators each having internal hysteresis can be used. For example, one comparator can receive a threshold at 2.9 V that acts mainly to determine that the sensor is powered. A second comparator can receive a threshold at 4 V with a few hundred mV of hysteresis. If the supply voltage is below the 4 V threshold, then it can be determined that the supply voltage is at 3.3 V and if the supply voltage is above the 4 V threshold, then it can be determined that he supply voltage is at 5 V.

It will also be appreciated that while this example describes sensor 200 having two supply voltage ranges, more than two supply voltage ranges are also possible. In sensors that accommodate more than two supply voltage ranges, the supply voltage signal 240 may be a digital signal having more than two levels or states for example.

The supply voltage signal 240 can be coupled to coarse gain selection block 252 and coarse offset selection block 256 in order to thereby control selection of a coarse gain and offset, respectively. Coarse gain selection block 252 and coarse offset selection block 256 can take various forms to correlate the supply voltage signal 240 to coarse gain and offset adjustments, respectively, depending on the form of the supply voltage signal 240. For example, blocks 252 and 256 can include one or more look-up tables that contain values that correlate values of the supply voltage signal 240 with corresponding gain and offset values. In an example embodiment, if the supply voltage VCC is detected to be between 3.0 volts and 3.6 volts (nominal 3.3V), then coarse gain and offset settings can be a QVO of 1.65 V and a gain of 33 mV/A, respectively, and if the supply voltage VCC is detected to be between 4.5 and 5.5 V (nominal 5V), then coarse gain and offset settings can be a QVO of 2.5 V and a gain of 50 mV/A, respectively. QVO is the voltage on the output VIOUT 224 when zero amps are applied through the conductor 216.

Coarse gain selection block 252 and coarse offset selection block 256 can be configured to convert the supply voltage signal 240 into an analog signal that can be applied to amplifier 238 and to summation element 244, respectively, in order to thereby introduce a gain adjustment optimized for the detected supply voltage level. For example, coarse gain selection block 252 can include switches in different resistors to change the gain of the amplifier 238 and coarse offset selection block 256 can select a different voltage from a resistor ladder to add in via summation element 244 or can adjust the reference for Digital-to-Analog converters (DACs) within the fine sensitivity control block 262 and/or fine offset control blocks 264, 266.

Further, the relationship between the optimized coarse gain and offset values provided by coarse gain selection block 252 and coarse offset selection block 256 and the value, or level of the supply voltage signal 240 can be a non-linear relationship as necessary to optimize sensor performance for the discrete supply voltage range represented by the supply voltage signal. An optional digital computation block 258 can perform a computation to translate the supply voltage signal 240 into configuration signals, which configuration signals can be coupled to coarse gain selection block 252 and coarse offset selection block to establish switch settings accordingly.

Sensor 200 can include a digital system 270 including a controller, or processor 278, memory 250, and other elements for digital control of aspects of sensor operation. Controller 278 can perform various functions, including but not limited to delaying the sensor output signal VIOUT 224 following power up as discussed below.

As used herein, the term "processor" or "controller" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. A processor can contain internal processors or internal modules that perform portions of the function, operation, or sequence of operations of the processor. Similarly, a module can contain internal processors or internal modules that perform portions of the function, operation, or sequence of operations of the module.

Memory 250 can store settings for one or both of the adjustable gain or the adjustable offset based at least in part on which of a plurality of voltage ranges the supply voltage VCC 236 falls within. To this end, memory 250 can store settings for each of the plurality of supply voltage ranges. In the example of FIG. 2, memory 250 can include settings 280 as may correspond to a nominal 3.3 volt supply voltage VCC and as may include fine and temperature settings. Memory 250 can also include settings 282 as may correspond to a nominal 5.0 volt supply voltage VCC and as may include fine and temperature settings. Additional configuration settings 284 may be stored in memory 250 and may pertain to other sensor functionality, such as fault trip settings for example.

A multiplexer 272 can be coupled to receive stored settings 280, 282 and the supply voltage signal 240, as shown. Supply voltage signal 240 can operate as a control signal by which multiplexer 272 selectively couples either settings 280 or settings 282 to a compensation block 274 based on the detected supply voltage range. In some embodiments, the supply voltage signal 240 is a two-state signal indicative of the level of the supply voltage VCC being at a first nominal level or at a second nominal level as corresponds to the supply voltage VCC being within a first supply voltage range or a second supply voltage range. Other supply voltage signal formats are possible. For example, particularly in embodiments in which the sensor 200 accommodates more than two supply voltage ranges, the supply voltage signal 240 may be a signal having three or more possible levels in order to uniquely indicate the detected supply voltage range.

The multiplexer output can be coupled to a compensation block 274, as shown. A temperature sensor 290 can measure a temperature associated with the sensor and provide a signal indicative of the measured temperature to the compensation block 274. In some embodiments, temperature sensor 290 includes an analog circuit and an Analog-to-Digital converter (ADC) to provide a digital temperature signal that is proportional to the die temperature.

The compensation block 274 can combine the measured temperature with the received settings to generate a fine and TC (temperature coefficient) signal for coupling to control blocks 262, 264, and 266, as shown. For example, compensation block 274 can use the stored settings as coefficients for an equation over temperature that can be piece-wise linear or second order, as examples. The output of compensation block 274 represents how much to change the gain or offset.

Fine sensitivity control block 262 and fine offset control blocks 264, 266 can include DACs to convert their digital input signals into analog voltages for adjusting the gain of amplifier 232 and the offset of amplifiers 246 and 248, respectively. Amplifiers 246 and 248 are summing amplifiers that sum in the value from the DACs 264, 266, respectively. Amplifier 232 can be a variable gain amplifier where the value from the DAC 262 changes the gain.

The number of bits (i.e., resolution) of the DACs in blocks 252, 256, 262, 264 can vary to suit a particular application requirements. In general, the coarse control blocks 252, 256 will have fewer bits (e.g., four bits) than the fine control blocks 262, 264, 266.

Digital system 270 may include additional elements such as a programming control block 276. Block 276 can be configured to program the IC memory 250 with configuration settings in order to control various parameters, as is generally performed during production. For example, block 276 can program the output protocol, or format used to communicate sensor output signal information to external systems.

Sensor 200 may include one or more filters to prevent voltage spikes on the supply voltage VCC 236 from affecting the supply voltage signal 240. For example, such optional filters can include an analog filter 292 and/or a digital filter 294. Analog filter 292 can smooth the supply voltage VCC 236 in order to thereby eliminate certain supply voltage spikes. Digital filter 294 can function as a so-called de-glitch element as may include a timer to ensure that the state of the supply voltage signal 240 is stable before acting on a transition. With one or both such filters, inaccurate supply voltage detection, for example as may be based on noise or other disturbances such as EMC, can be avoided.

Additional elements of sensor 200 include a voltage regulator 296 to generate one or more regulated voltages to power sensor circuitry. While the magnetic field sensor 200 may be provided in the illustrated form of an IC with an analog signal path 220, analog output signals 224, 226, and a digital system 270, it will be appreciated that the particular delineation of which circuit functions are implemented in an analog fashion or with digital circuitry and signals can be varied. Further, some of the illustrated circuit functions can be implemented on an integrated circuit sensor 200 and other circuitry and functionality can be implemented on separate circuits (e.g., additional substrates within the same integrated circuit package, or additional integrated circuit packages, and/or on circuit boards).

Sensor 200 includes circuitry for monitoring and detecting faults, failures, or errors. Examples include, but are not limited to overcurrent conditions, regulated voltages being above or below specified ranges, etc. In the example embodiment, fault detection circuitry can include a comparator 222 by which the output signal of amplifier 238 is compared to a threshold. An output of the comparator 222 can be coupled to a driver 228, as may take the form of the illustrated transistor that is turned on to provide a logic low signal at the FAULT output 212d for example when a fault is detected and that is turned off to allow the FAULT output 212d to be pulled up to a pull up voltage established by a voltage regulator 268 through a resistor 254 when a fault is not detected.

According to an aspect of the disclosure, the pull up voltage generated by regulator 268 to establish the voltage to which the FAULT signal is pulled up to indicate a fault can be configured based on the detected supply voltage range. To this end, the output signal of multiplexer 272 can be coupled to regulator 268 to set the regulated pull up voltage coupled to the pull up resistor 254 based on the selected stored fine and TC settings 280, 282.

According to another aspect of the disclosure, the fault trip point(s) that establish the threshold coupled to comparator 222 can be configurable based on the detected supply voltage range. With this arrangement, faults can be accurately detected for the particular discrete supply voltage range of the sensor. To this end, a conversion block 260 can be coupled to receive the output signal of multiplexer 272.

Conversion block 260 can compute the fault trip level based on the stored settings at the output of multiplexer 272 according to a predetermined relationship. For example, the fault trip point "y" can have a linear relationship with respect to the stored settings, such that the selected stored settings provide the slope "m" and y-intercept "b" coefficients of the linear relationship y=mx+b as computed by the conversion block 260 and "x" is the desired trip level in amps, which is set in EEPROM at the factory. In other words, "m" and "b" are coefficients for converting from x to the signal level seen at x amps and "m" and "b" are changed based on the supply voltage level. It will be appreciated by those of ordinary skill in the art however that the particular equation utilized by the conversion block 260 can be tailored to suit particular sensor implementations and requirements.

Additionally or alternatively, the fault trip points(s) can be user-programmable, such as by providing an external input signal at a VOC terminal 212c coupled to the conversion block 260 as shown. Alternatively, the external input signal provided at the VOC terminal 212c can be coupled directly to the comparator 222. The VOC signal has a predetermined relationship with respect to the desired trip level. For example, the VOC signal can be a constant or set using a resistor divider from VCC or VREF. In this scenario, the VOC signal provides "x" in the computation performed by conversion block 260 such that the conversion block converts the VOC signal to the fault trip level and "m" and "b" are changed based on the supply voltage level.

The sensor output signal VIOUT 224 can be held off (i.e., delayed) for a period of time following power up in order to provide enough time for the sensor to load its volatile registers from memory 250 and get analog bias voltages to the proper level, etc. in order to ensure that the sensor output signal VIOUT 224 turns on in the correct state. For example, a digital timer can be provided that starts once the digital system 270 turns on. Once the timer runs out, the output VIOUT 224 can be released. To this end, controller 278 can generate a digital signal for coupling to the buffer 246 to cause the buffer to either be high impedance or pull low until the sensor is ready to start reporting an output.

According to an aspect of the disclosure, this delay interval (i.e., the time interval during which the sensor output is held off, or delayed following a reset event) can be extended to wait for the supply voltage VCC 236 to settle in order to ensure that the supply voltage is accurately detected by supply voltage detector 230. This extended time period can be user-programmable or preset.

Because the ramp rate of the supply voltage VCC 236 is not controlled, determining the proper extended time interval can be challenging. In embodiments, the derivative of the supply voltage VCC can be measured to determine when the supply voltage has stopped significant changes. Further, if there are only two possible supply voltage ranges, as soon as the supply voltage VCC passes a certain amount beyond the first nominal level, the sensor output can be released since such a supply voltage detection can indicate that the supply voltage falls within the second supply voltage range.

It will be appreciated that a possible alternative to controller 278 extending the start up output delay as explained above, the supply voltage detector 230 can include combinational logic to implement the output signal delay until the time that the supply voltage is determined to have settled.

The supply voltage signal 240 can be latched after the delay interval as an additional precaution to prevent gain and/or offset jumps. Alternatively, the supply voltage signal 240 can be latched after it has been in a particular state, or level for more than a predetermined interval.

As a possible alternative or addition to holding the sensor output off for a period of time following a power on or reset event, in some embodiments, the initial gain can be set to a predetermined point, such as a midpoint, within its range and/or only gradual changes to the gain could be permitted on power up and power down of the sensor in order to prevent large steps, or spikes in the output signal. Such an arrangement can be implemented by providing more bits to the coarse settings and having the digital control respond to changes in voltage by changing through these bits step by step with a fixed time between steps in order to effectively ramp the gain changes.

According to a further aspect of the disclosure, the reference voltage VREF 226 provided at pin 212f can be adjusted based on the detected supply voltage range. For example, when the supply voltage VCC is detected to be within a range corresponding to a nominal 5V, the reference voltage VREF 226 can be at 2.5V; whereas when the supply voltage is detected to be within a range corresponding to a nominal 3.3V, the reference voltage VREF 226 can be at 1.5V.

Figure 3:
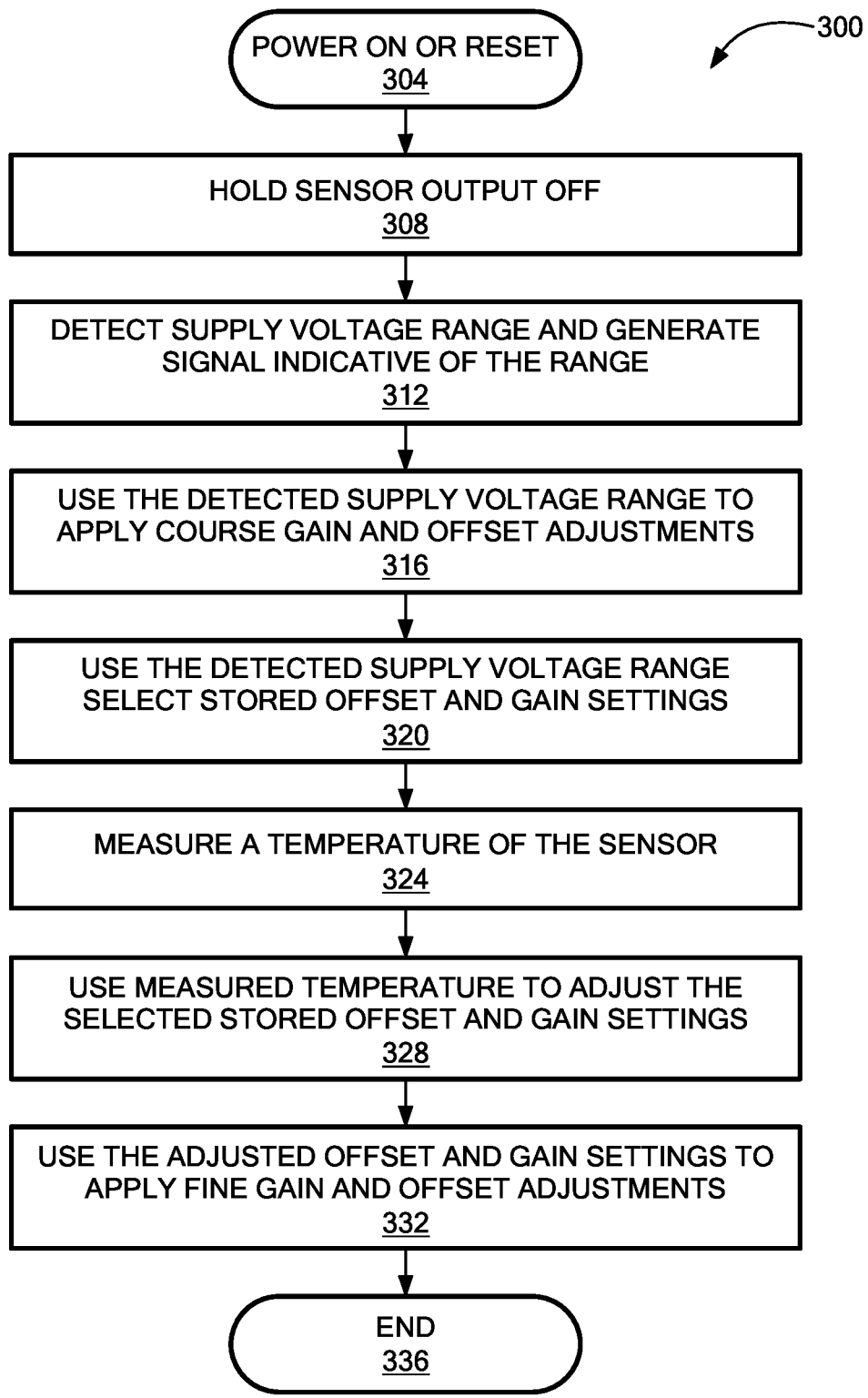
FIG. 3 is a flow diagram illustrating a process for sensor configuration based on supply voltage.

Referring also to FIG. 3, an example process 300 is shown for configuring a sensor 10, 200 based on a range within which the supply voltage VCC falls. At block 304, the sensor is powered on or otherwise reset. Sensor reset events can include powering on the sensor (i.e., at start up), coming out of a safe state (i.e., a retry), an ESD event of a predetermined magnitude or, more generally, any condition upon which the controller 278 considers the sensor to be reset.

Following the sensor reset event, in block 308, the sensor output (e.g., driver 246) is held off for a duration in order to allow the supply voltage VCC 236 to settle. As explained above, the duration can be programmable, preset, or otherwise determined.

At block 312, the supply voltage VCC 236 is measured by the supply voltage detector 230 in order to generate the supply voltage signal 240 having a level indicative of the range of supply voltages within which the supply voltage VCC falls. For example, the sensor may have three possible supply voltage ranges and comparators of the supply voltage detector 230 can determine which of the three ranges the supply voltage falls within.

The supply voltage signal 240 is used, at block 316, to apply coarse adjustment to the signal path gain (e.g., with amplifier 238) and/or to the signal path offset (e.g., by adding a coarse offset value to the output of amplifier 238 with summation element 244).

At block 320, the supply voltage signal 240 is used to select gain and offset setting stored in memory 250 based on the detected supply voltage range. For example, when the supply voltage VCC is determined to fall within a range corresponding to a nominal 3.3V supply voltage, then settings 280 are selected by operation of multiplexer 272 and when the supply voltage is determined to fall within a range corresponding to a nominal 5.0V supply voltage, then settings 282 are selected by operation of multiplexer 272. The selected settings are coupled to compensation block 274 as explained above.

A temperature associated with the sensor can be measured at block 324 to generate a temperature signal and such signal coupled to compensation block 274. At block 328, compensation block 274 can adjust the selected settings based on the measured temperature in order to further optimize (i.e., trim) the settings, not only for supply voltage range, but also for temperature variations.

The offset and gain settings thus adjusted for temperature can provide fine offset and gains settings to be applied to at block 332. For example, application of such fine settings can be achieved by control block 262 and amplifier 232 and also by control blocks 264, 266 and amplifiers 246, 248, respectively.

At block 336, the process terminates. It will be appreciated that the process 300 can be performed only upon power up or could be performed more often, such as periodically during operation of the sensor to ensure that the sensor does not make an incorrect supply voltage level determination initially upon an unusual power up event such as an EMC event for example. It will be appreciated that while the blocks of FIG. 3 are shown serially, certain operations can be performed in parallel.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

It should be understood that a so-called comparator can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A sensor comprising:
   a sensing element configured to generate a sensing element output signal indicative of a sensed parameter;
   a fine sensitivity control block;
   a coarse gain selection block;
   a coarse offset selection block;
   a signal path responsive to the sensing element output signal, wherein the signal path is configured to generate a sensor output signal indicative of the sensed parameter, and wherein the signal path comprises: (i) an amplifier for amplifying the sensing element output signal; (ii) a summation element for applying an offset to the sensing element output signal, and (iii) an output driver for generating the sensor output signal;
   a supply voltage detector configured to generate a supply voltage signal indicative of which of a plurality of voltage ranges a supply voltage of the sensor falls within, the supply voltage signal being a digital signal having at least a plurality of states, each of the plurality of states corresponding to a different one of the plurality of voltage ranges; and
   a computation block configured to perform a coarse offset adjustment and a coarse gain adjustment on the sensor output signal, the coarse offset adjustment and the coarse gain adjustment being performed based on the supply voltage signal, the coarse offset adjustment and the coarse gain adjustment being performed after a fine sensitivity control is performed on the sensor output signal by the fine sensitivity control block, the coarse offset adjustment and the coarse gain adjustment being performed by providing one or more configuration signals to the coarse gain selection block and the coarse offset selection block thereby causing: (a) the coarse gain selection block to adjust a gain of the amplifier and (b) the coarse offset selection block to adjust the offset that is being applied by the summation element.

2. The sensor of claim 1, further comprising a memory configured to store settings associated with the plurality of voltage ranges.

3. The sensor of claim 2, further comprising a multiplexer coupled to receive the supply voltage signal and configured to selectively couple the settings to the signal path.

4. The sensor of claim 3, further comprising a temperature sensor to provide a temperature measurement, wherein the settings are coupled based on the temperature measurement.

5. The sensor of claim 1, wherein the supply voltage detector is coupled to receive the supply voltage and comprises at least one comparator configured to generate the supply voltage signal indicative of which of the plurality of voltage ranges the supply voltage falls within.

6. The sensor of claim 5, wherein the at least one comparator has hysteresis.

7. The sensor of claim 1, wherein the supply voltage detector is arranged to receive an externally programmable signal indicative of which of the plurality of voltage ranges the supply voltage falls within, the externally programmable signal being received via one or more terminals of the sensor.

8. The sensor of claim 1, wherein the sensor is provided as an integrated circuit.

9. The sensor of claim 1, wherein the plurality of voltage ranges comprises two voltage ranges and wherein the supply voltage signal is a two-state signal indicative of which of the two voltage ranges the supply voltage falls within.

10. The sensor of claim 1, further comprising a delay circuit configured to delay the sensor output signal following power up of the sensor.

11. The sensor of claim 1, further comprising a filter configured to prevent voltage spikes on the supply voltage from affecting the supply voltage signal.

12. A method for providing a sensor comprising:
   detecting which of a plurality of voltage ranges a supply voltage of the sensor falls within and generating a supply voltage signal, the supply voltage signal being a digital signal having at least a plurality of states, each of the plurality of states corresponding to a different one of the plurality of voltage ranges;
   sensing a parameter with a sensing element to generate a sensing element output signal;
   performing a fine sensitivity control on the sensing element output signal;
   performing a coarse gain adjustment and a coarse offset adjustment on the sensing element output signal, the coarse gain adjustment and the course offset adjustment being performed based on the supply voltage signal, the coarse gain adjustment and the coarse offset adjustment being performed after the fine sensitivity control is performed on the sensing element output signal, and generating, by an output driver, a sensor output signal that corresponds to the sensing element output signal, wherein performing the coarse gain adjustment and the course offset adjustment includes generating one or more configuration signals and providing the one or more configuration signals to a coarse gain selection block and a coarse offset selection block, thereby causing: (a) the coarse gain selection block to adjust a gain of the sensing element output signal and (b) the coarse offset selection block to adjust an offset that is being applied to the sensing element output signal.

13. The method of claim 12, wherein the coarse gain selection blocs adjusts the gain of the sensing element output signal by reconfiguring an amplifier that is arranged to amplify the sensing element output signal, and the coarse offset selection block adjusts the offset of the sensing element output signal by reconfiguring a summation element that is arranged to offset the sensing element output signal.

14. The method of claim 12, further comprising performing a fine gain adjustment on the sensing element output signal based, at least in part, on one or more settings that correspond to a current state of the supply voltage signal.

15. The method of claim 14, wherein the fine gain adjustment is performed further based on a temperature of the sensor.

16. The method of claim 12, wherein detecting which of the plurality of voltage ranges the supply voltage of the sensor falls within includes comparing the supply voltage to a plurality of thresholds.

17. A sensor comprising:
a sensing element configured to generate a sensing element output signal indicative of a sensed parameter;
means for detecting which of a plurality of voltage ranges a supply voltage of the sensor falls within and generating a supply voltage signal having at least a plurality of states, each of the plurality of states corresponding to a different one of the plurality of voltage ranges;
means for performing a fine sensitivity control on the sensing element output signal; and
means for performing a coarse gain adjustment and a coarse offset adjustment on the sensing element output signal, the coarse gain adjustment and the coarse offset adjustment being performed based on the supply voltage signal, the coarse gain adjustment and the coarse offset adjustment being performed after the fine sensitivity control is performed on the sensing element output signal,
wherein performing the coarse gain adjustment find the coarse offset adjustment includes generating one or more configuration signals and providing the one or more configuration signals to a coarse gain selection block and a coarse offset selection block, thereby causing: (a) the coarse gain selection block to adjust a gain of the sensing element output signal and (b) the coarse offset selection block to adjust an offset that is being applied to the sensing element output signal.

18. A sensor comprising:
a sensing element configured to generate a sensing element output signal indicative of a sensed parameter;
a signal path responsive to the sensing element output signal, wherein the signal path is configured to generate a sensor output signal indicative of the sensed parameter, and wherein the signal path comprises: (i) an amplifier for amplifying the sensing element output signal; and (ii) an output driver for generating the sensor output signal;
a supply voltage detector configured to generate a supply voltage signal indicative of which of a plurality of voltage ranges a supply voltage of the sensor falls within, the supply voltage signal having at least a plurality of states, each of the plurality of states corresponding to a different one of the plurality of voltage ranges;
a coarse gain selection block;
a fine sensitivity control block; and
a computation block configured to perform a coarse gain adjustment on the sensing element output signal, the coarse gain adjustment being performed based on the supply voltage signal, the coarse gain adjustment being performed after a fine sensitivity control is performed on the sensing element output signal by the fine sensitivity control block, the coarse gain adjustment being performed by providing a first configuration signal to the coarse gain selection block thus causing the coarse gain selection block to adjust a gain of the amplifier.

19. The sensor of claim 18, further comprising a coarse offset selection block, wherein the computation block is further configured to perform a coarse offset adjustment on the sensing element output signal, the coarse offset adjustment being performed based on the supply voltage signal, the coarse offset adjustment being performed after the fine sensitivity control, the coarse offset adjustment being performed by providing a second configuration signal to the coarse offset selection block thus causing the coarse offset selection block to adjust an offset value that is applied to the sensing element output signal by a summation element.

20. The sensor of claim 18, wherein the supply voltage signal is a digital signal.

* * * * *